United States Patent
Watanabe et al.

[11] Patent Number: 5,876,900
[45] Date of Patent: Mar. 2, 1999

[54] CHEMICALLY AMPLIFIED POSITIVE RESIST COMPOSITION

[75] Inventors: Satoshi Watanabe; Toshinobu Ishihara; Shigehiro Nagura, all of Nakakubiki-gun; Tsuguo Yamaoka, Funabashi, all of Japan

[73] Assignee: Shin-Etsu Chemical Co., Ltd., Japan

[21] Appl. No.: 831,300

[22] Filed: Apr. 1, 1997

[30] Foreign Application Priority Data

Apr. 2, 1996 [JP] Japan .................................. 8-104590

[51] Int. Cl.⁶ ............................ G03F 7/029; G03F 7/033
[52] U.S. Cl. .................... 430/288.1; 430/270.1; 430/905
[58] Field of Search ............... 430/270.1, 288.1, 430/905

[56] References Cited

U.S. PATENT DOCUMENTS

| | | | |
|---|---|---|---|
| 4,442,197 | 4/1984 | Crivello et al. | 430/288.1 |
| 5,352,564 | 10/1994 | Takeda et al. | 430/270.1 |
| 5,364,738 | 11/1994 | Kondo et al. | 430/270.1 |
| 5,468,589 | 11/1995 | Urano et al. | 430/170 |
| 5,558,971 | 9/1996 | Urano et al. | 430/270.1 |
| 5,677,112 | 10/1997 | Urano et al. | 430/270.1 |
| 5,695,910 | 12/1997 | Urano et al. | 430/270.1 |

FOREIGN PATENT DOCUMENTS

| | | |
|---|---|---|
| 63-27829 | 2/1988 | Japan . |
| 63-149640 | 6/1988 | Japan . |
| 2-27660 | 6/1990 | Japan . |
| 5-127369 | 5/1993 | Japan . |
| 5-232706 | 9/1993 | Japan . |
| 5-249662 | 9/1993 | Japan . |
| 5-249683 | 9/1993 | Japan . |
| 5-257283 | 10/1993 | Japan . |
| 5-265213 | 10/1993 | Japan . |
| 5-289340 | 11/1993 | Japan . |
| 6-230574 | 8/1994 | Japan . |
| 6-242605 | 9/1994 | Japan . |
| 6-266110 | 9/1994 | Japan . |
| 6-266111 | 9/1994 | Japan . |
| 7-92678 | 4/1995 | Japan . |
| 7-92680 | 4/1995 | Japan . |
| 7-92681 | 4/1995 | Japan . |
| 7-118651 | 5/1995 | Japan . |
| 7-120929 | 5/1995 | Japan . |
| 7-128859 | 5/1995 | Japan . |
| 7-134419 | 5/1995 | Japan . |
| 7-209868 | 8/1995 | Japan . |

OTHER PUBLICATIONS

English abstract of JP–A 265213/93.

*Primary Examiner*—John S. Chu
*Attorney, Agent, or Firm*—Miller, White, Zelano, & Branigan, P.C.

[57] ABSTRACT

A chemically amplified positive resist composition contains (A) an organic solvent, (B) a base resin in the form of a polyhydroxystyrene having phenolic hydroxyl groups some of which are protected with alkoxyalkyl groups and having a weight-average molecular weight of 3,000–300,000 and a dispersity of 1.0 to 1.5, (C) a photoacid generator, and (D) a vinyl ether group-containing compound. The composition is sensitive to actinic radiation, especially KrF excimer laser beam, has high sensitivity and resolution, and forms a resist pattern having improved plasma etching resistance and heat resistance.

29 Claims, No Drawings

CHEMICALLY AMPLIFIED POSITIVE RESIST COMPOSITION

BACKGROUND OF THE INVENTION

1. Field of the Invention

This invention relates to a chemically amplified positive resist composition which is highly sensitive to actinic radiation such as deep-UV, electron beam and X-ray, can be developed with alkaline aqueous solution to form a pattern, and is thus suitable for use in a fine patterning technique.

2. Prior Art

As the LSI technology tends toward higher integration and higher speed, further refinement of pattern rules is required. The current patterning technology mostly relies on light exposure which is now approaching the essential limit of resolution which is dictated by the wavelength of a light source. It is generally recognized that in light exposure using g-line (wavelength 436 nm) or i-line (wavelength 365 nm) as a light source, a pattern rule of about 0.5 $\mu$m is the limit. For LSIs fabricated by such light exposure technique, a degree of integration equivalent to 16 mega-bit DRAM is the limit. At present, LSIs fabricated in the laboratory have reached this stage. It is urgently required to develop a finer patterning technique.

Under such circumstances, deep-ultraviolet lithography is regarded promising as the next generation of fine patterning technology. The deep-UV lithography is capable of working on the order of 0.3 $\mu$m or 0.4 $\mu$m. If a less light absorbing resist is used, it is possible to form a pattern having a side wall nearly perpendicular to the substrate. Advanced engineers place focus on the utilization of high illuminance KrF excimer laser as a deep-UV source. A resist material having high resolution and sensitivity must be developed before such an excimer laser can be used in a mass scale manufacturing technique.

In this respect, recently developed chemical amplification positive resist materials using acid catalysts as disclosed in JP-B 27660/1990, JP-A 27829/1988, U.S. Pat. No. 4,491,628 and 5,310,619 are regarded promising as resist materials especially suited for deep-UV lithography because these materials have relatively high sensitivity, resolution and dry etching resistance. The chemically amplified, positive resist materials being known include those of the two-component system comprising an alkali-soluble base resin and a photoacid generator and those of the three-component system comprising an alkali-soluble base resin, a photoacid generator, and a dissolution inhibitor having an acid labile group. It is desired to further improve the resolution and heat resistance during dry etching of such resist materials.

Use of an acid labile group different from common acid labile groups such as tert-butoxycarbonyl and tert-butyl groups as used in the aforementioned chemical amplification positive resist compositions is proposed in JP-A 83055/1994 and 128859/1995 which disclose chemical amplification positive resist compositions using an acid labile group of acetal type. It is also desired to further improve the resolution and heat resistance during dry etching of these resist materials.

JP-A 230574/1994 discloses a chemically amplified positive resist composition comprising a linear polymer having an acid group (e.g., carboxylic acid, sulfonic acid and phenolic hydroxyl group), a photoacid generator, and a compound having at least two vinyl ether groups in a molecule. In this resist composition, the compound having at least two vinyl ether groups in a molecule is contained for the purpose of alkali dissolution control. Since the base resin has increased alkali dissolution, the vinyl ether group-containing compound must be contained in a large amount, with possible generation of scum upon development. If the amount of the vinyl ether group-containing compound added is reduced, there occurs shortage of dissolution contrast and hence, a decline of resolution. It is thus desired to further improve resolution and suppress scum generation.

Furthermore, JP-A 265213/1993 discloses a chemically amplified positive resist composition comprising a polymer containing a phenolic hydroxyl group replaced by a 2-vinyloxyalkylene group and a photoacid generator. Since the 2-vinyloxyalkylene group is not an acid labile group, the polymer is less alkali soluble. Low dissolution contrast results in shortage of resolution. It is thus desired to further improve resolution.

SUMMARY OF THE INVENTION

Therefore, an object of the present invention is to provide a chemically amplified positive resist composition which has resolution high enough to lend itself to a fine processing technique and forms a resist pattern resistant to heat during etching.

We have found that a chemically amplified positive resist composition comprising (A) an organic solvent, (B) a base resin in the form of a polymer having recurring units of the general formula (1) shown below, and having a weight-average molecular weight of 3,000 to 300,000, (C) a photoacid generator, (D) a compound having at least two vinyl ether groups in a molecule, and optionally (E) a dissolution rate regulator has resolution high enough to lend itself to a fine processing technique, forms a resist pattern which is resistant to heat during etching, and is advantageously applicable to deep-UV lithography.

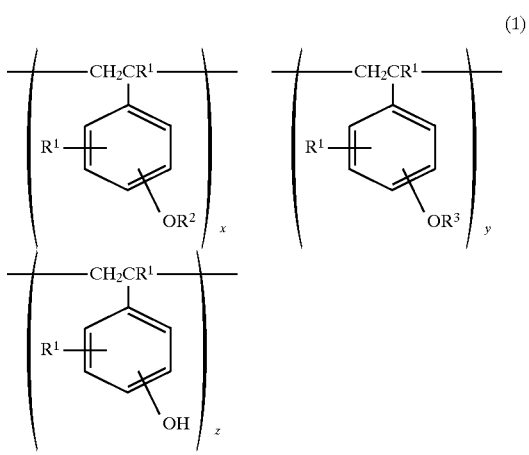

In formula (1), $R^1$ is a hydrogen atom or methyl group; $R^2$ is a group represented by the following general formula (2); $R^3$ is an acid labile group different from $R^2$; and letters x and y are 0 or a positive number, x and y are not equal to 0 at the same time, and z is a positive number, x, y and z satisfy $0 \leq x/(x+y+z) \leq 0.5$, $0 \leq y/(x+y+z) \leq 0.5$, $0.4 \leq z/(x+y+z) \leq 0.9$, and $x+y+z=1$.

In formula (2), $R^4$ and $R^5$ are independently a hydrogen atom or a normal or branched alkyl group having 1 to 6 carbon atoms, $R^6$ is a normal, branched or cyclic alkyl group having 1 to 10 carbon atoms, or $R^4$ and $R^5$, $R^4$ and $R^6$, or $R^5$ and $R^6$, taken together, may form a ring. Where a ring is formed, $R^4$, $R^5$ and $R^6$ are independently a normal or branched alkylene group having 1 to 6 carbon atoms.

The chemically amplified positive resist composition of the invention mainly contains a high molecular weight compound of formula (1), which is a polyhydroxystyrene derivative having hydroxyl groups partially replaced by an acid labile group, having a weight-average molecular weight of 3,000 to 300,000 as base resin (B) and a compound having at least two vinyl ether groups in a molecule as component (D). The resist composition not only has an increased dissolution contrast owing to the function of an acid labile group contained in the base resin of formula (1) and the function of a vinyl ether group capable of chemically converting into an acid labile group through heat cross-linking, but is also improved in heat resistance during etching because the crosslinked structure is maintained in unexposed areas.

More particularly, when the chemically amplified positive resist composition of the invention is spin coated and then prebaked at about 60° to 150°C., heat cross-linking occurs between the compound having at least two vinyl ether groups in a molecule and the base resin having hydroxyl groups partially replaced by an acid labile group whereby the alkali solubility of the base resin is further reduced. Upon subsequent exposure to actinic radiation causing decomposition of the photoacid generator to generate an acid and post-exposure baking (PEB) typically at 60° to 150°C., an acid labile group in the base resin, dissolution rate regulator or photoacid generator and a vinyl ether group which has been chemically converted into an acid labile group by heat crosslinking of the compound having at least two vinyl ether groups in a molecule are decomposed to create various phenol derivatives having high alkali solubility, accomplishing a high dissolution contrast. In this way, the chemically amplified positive resist composition of the invention exerts improved performance, producing a resist image featuring high resolution, a wide range of focal depth and heat resistance upon etching.

DESCRIPTION OF THE PREFERRED EMBODIMENTS

The chemically amplified, positive working resist composition of the invention is applicable as a three-component system comprising an alkali-soluble base resin, a photoacid generator, and a vinyl ether group-containing compound or a four-component system comprising an alkali-soluble base resin, a photoacid generator, a vinyl ether group-containing compound, and a dissolution rate regulator. Especially preferred is a chemically amplified positive resist composition of the three-component system.

With respect to the preferred blending ratio, the chemically amplified positive resist composition according to the invention contains:

(A) about 150 to 700 parts, especially about 250 to 500 parts by weight of an organic solvent, (B) about 70 to 90 parts, especially about 75 to 85 parts by weight of a base resin, (C) about 0.5 to 15 parts, especially about 1 to 8 parts by weight of a photoacid generator, (D) about 0.5 to 24 parts, especially about 1 to 10 parts by weight of a compound having at least two vinyl ether groups in a molecule, (E) 0 to about 40 parts, especially about 6 to 30 parts by weight of a dissolution rate regulator, and (F) 0 to about 2 parts, especially about 0.01 to 1 part by weight of a basic compound. The amount of each component is discussed later based on this combination.

Examples of the organic solvent (A) include ketones such as cyclohexanone, 2-heptanone, 3-heptanone, and 4-heptanone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether, ethylene glycol-tert-butyl ether methyl ether (1-tert-butoxy-2-methoxyethane), and ethylene glycol-tert-butyl ether ethyl ether (1-tert-butoxy-2-ethoxyethane); and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and methyl β-methoxyisobutyrate alone or in admixture of two or more. The preferred solvents are 1-ethoxy-2-propanol ensuring solubility of resist components and propylene glycol monomethyl ether acetate (α and β types) ensuring safety and solubility of resist components. These solvents may be used alone or in admixture of two or more.

The amount of the organic solvent used is preferably set to about 150 to 700 parts, more preferably about 250 to 500 parts by weight in order to form a resist film of 0.4 to 4 μm. Compositions with less than 150 parts of the solvent would somewhat lack film formability and yield thicker resist films whereas compositions with more than 700 parts of the solvent would form too thin films.

The base resin (B) is a high molecular weight compound or polymer having recurring units of the following general formula (1), especially the following general formula (3), and having a weight-average molecular weight of 3,000 to 300,000.

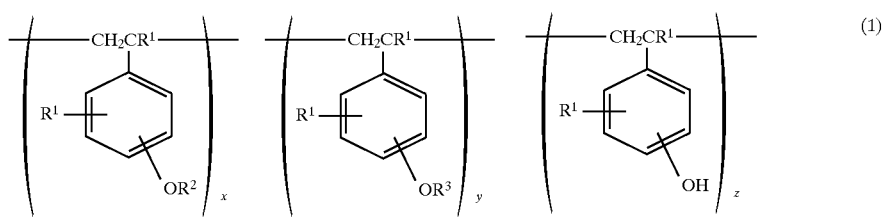

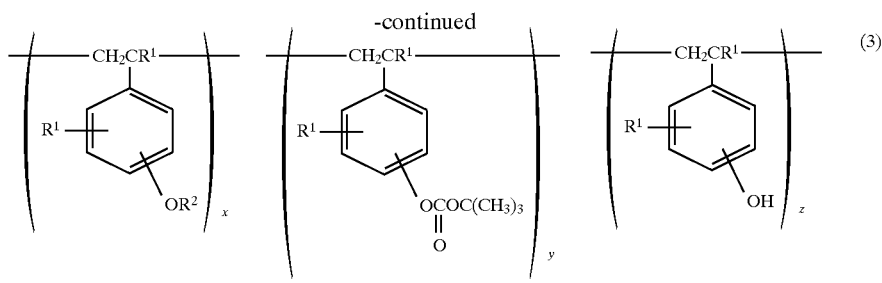

(3)

In formulae (1) and (3), $R^1$ is a hydrogen atom or methyl group. $R^2$ is a group of the following general formula (2). $R^3$ is an acid labile group different from $R^2$. $R^3$ may be a group of formula (2) insofar as $R^3$ is different from $R^2$.

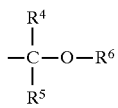

(2)

In formula (2), $R^4$ and $R^5$ are independently a hydrogen atom or a normal or branched alkyl group having 1 to 6 carbon atoms, $R^6$ is a normal, branched or cyclic alkyl group having 1 to 10 carbon atoms. Alternatively, $R^4$ and $R^5$, $R^4$ and Rs, or $R^5$ and $R^6$, taken together, may form a ring. When two $R^5$ form a ring, $R^4$, $R^5$ and $R^6$ are independently a normal or branched alkylene group having 1 to 6 carbon atoms.

Illustrative examples of the group represented by formula (2) include linear or branched acetal groups such as 1-ethoxyethyl, 1-n-propoxyethyl, 1-iso-propoxyethyl, 1-n-butoxyethyl, 1-iso-butoxyethyl, 1-sec-butoxyethyl, 1-tert-butoxyethyl, 1-tert-amyloxyethyl, 1-ethoxy-n-propyl, and 1-cyclohexyloxyethyl groups; and cyclic acetal groups such as tetrahydrofuranyl and tetrahydropyranyl groups. Preferred are 1-ethoxyethyl, 1-n-butoxyethyl, and 1-ethoxy-n-propyl groups.

Therefore, $R^2$ may be selected from the above-exemplified groups. $R^3$ may also be selected from the above-exemplified groups so as to differ from $R^2$ while it may be further selected from tert-butyl derivative groups such as tert-butyl, tert-butoxycarbonyl, and tert-butoxycarbonyl-methyl groups, and β-ketoalkyl groups such as 3-oxycyclohexyl. Preferably $R^3$ is a tert-butoxycarbonyl group.

Letters x and y are 0 or a positive number, x and y are not equal to 0 at the same time, and z is a positive number. The ratio of x, y and z is selected so as to satisfy $0 \leq x/(x+y+z) \leq 0.5$, preferably $0.1 \leq x/(x+y+z) \leq 0.4$, $0 \leq y/(x+y+z) \leq 0.5$, preferably $0 \leq y/(x+y+z) \leq 0.2$, and $0.4 \leq z/(x+y+z) \leq 0.9$, preferably $0.6 \leq z/(x+y+z) \leq 0.8$. $x+y+Z=1$. If the proportion of x to the total (x+y+z) is more than 0.5, if the proportion of y to the total is more than 0.5, or if the proportion of z to the total is more than 0.9 or less than 0.4, then the contrast between alkali dissolution rates would lower to detract from resolution. By properly selecting the values of x, y and z within the above-defined range, the size and shape of a resist pattern can be controlled.

The high molecular weight compound or polymer of formula (1) has a weight-average molecular weight (Mw) of 3,000 to 300,000, preferably 5,000 to 30,000. With Mw<3,000, a resist composition is less resistant to heat. With Mw>300,000, a resist composition becomes low in alkali dissolution and hence, resolution.

In the base resin according to the present invention, a wide molecular weight dispersity (Mw/Mn) means that there are present low molecular weight polymers and high molecular weight polymers. If low molecular weight polymers are predominant, heat resistance would be poor. If high molecular weight polymers are predominant, which means the presence of less alkali soluble components, a footing phenomenon occurs after pattern formation. As the pattern rule becomes finer, the influence of molecular weight and its dispersity becomes more significant. In order to provide a resist composition suitable for processing to fine pattern dimensions, the base resin is preferably a monodisperse polymer having a dispersity of 1.0 to 1.5, especially 1.0 to 1.3.

The amount of the base resin added is preferably about 70 to 90 parts, especially about 75 to 85 parts by weight.

Typical examples of the photoacid generator (C) are onium salts including:
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethane-sulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate, and
dicyclohexylphenylsulfonium p-toluenesulfonate.

Other useful photoacid generators include β-ketosulfonate derivatives such as 2-cyclohexylcarbonyl-2-(p-toluenesulfonyl)propane and 2-isopropylcarbonyl-2-(p-toluenesulfonyl)propane; diazomethane derivatives such as bis(benzenesulfonyl)diazomethane, bis(cyclohexylsulfonyl)-diazomethane, and bis(tert-butylsulfonyl)diazomethane; disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate; sulfonate ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imide-yl sulfonates such as phthalimide-yl triflate, phthalimide-yl tosylate, 5-norbornene-2,3-dicarboxyimide-yl triflate, 5-norbornene-2,3-dicarboxyimide-yl tosylate, and 5-norbornene-2,3-dicarboxyimide-yl n-butylsulfonate.

Preferred among others are triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenyl-sulfonium p-toluenesulfonate, (p-tert-butoxyphenyl)diphenyl-sulfonium p-toluenesulfonate, and tris(p-tert-butoxyphenyl)-sulfonium p-toluenesulfonate. The photoacid generators may be used alone or in admixture of two or more.

Desirably, the photoacid generator is added in an amount of about 0.5 to 15 parts, especially about 1 to 8 parts by weight. Sensitivity would be low with less than 0.5 part of the photoacid generator. More than 15 parts of the photoacid generator would lower an alkali dissolution rate to detract from resolution. Additionally heat resistance lowers because monomeric components become excessive.

The chemically amplified positive resist composition of the invention further contains (D) a compound having at least two vinyl ether groups in a molecule.

The compounds having at least two vinyl ether groups in a molecule include vinyl ether compounds of the following general formulae (I) and (II).

$$A—[—O—(R^{14}—O)_n—CH=CH_2]_m \quad (I)$$

$$A—[—B—R^{14}—O—CH=CH_2]_m \quad (II)$$

In the formulae, A is an alkyl, aryl or heterocyclic group having a valence of m, B is —CO—O—, —NHCOO— or —NHCONH—, $R^{14}$ is a normal or branched alkylene group having 1 to 10 carbon atoms, letter n is 0 or an integer of 1 to 10, and m is an integer of 2 to 6.

The organic groups represented by A are exemplified below.

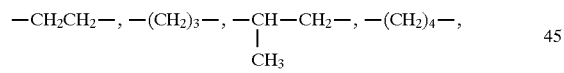

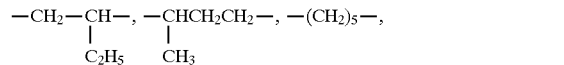

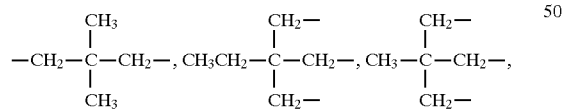

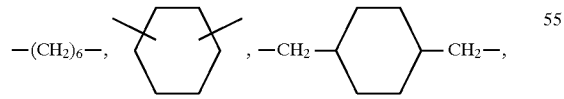

-continued

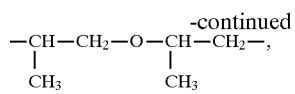

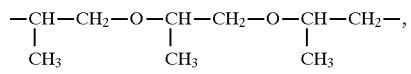

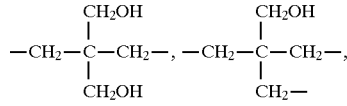

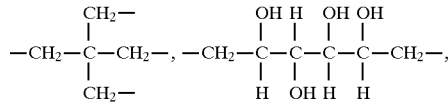

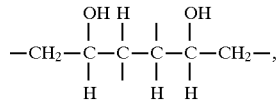

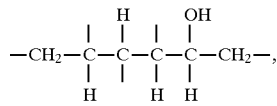

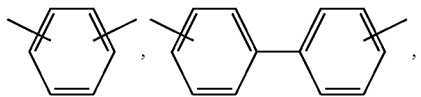

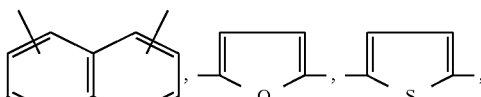

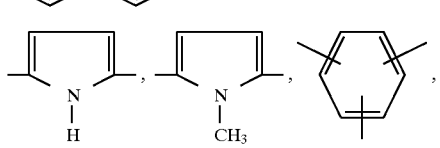

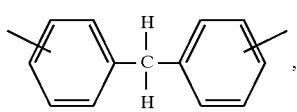

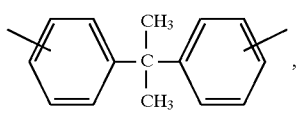

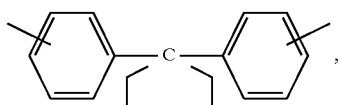

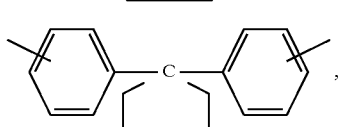

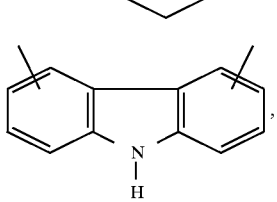

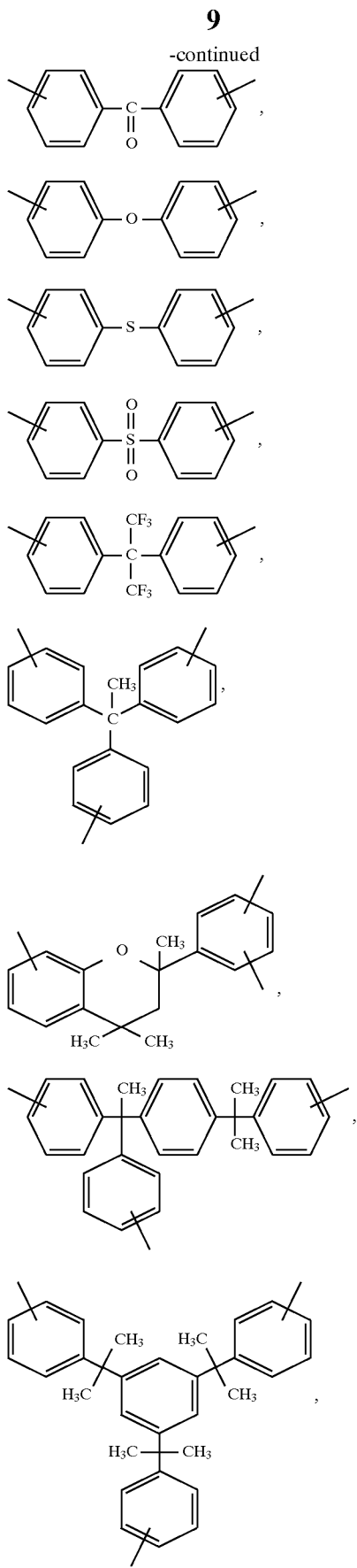

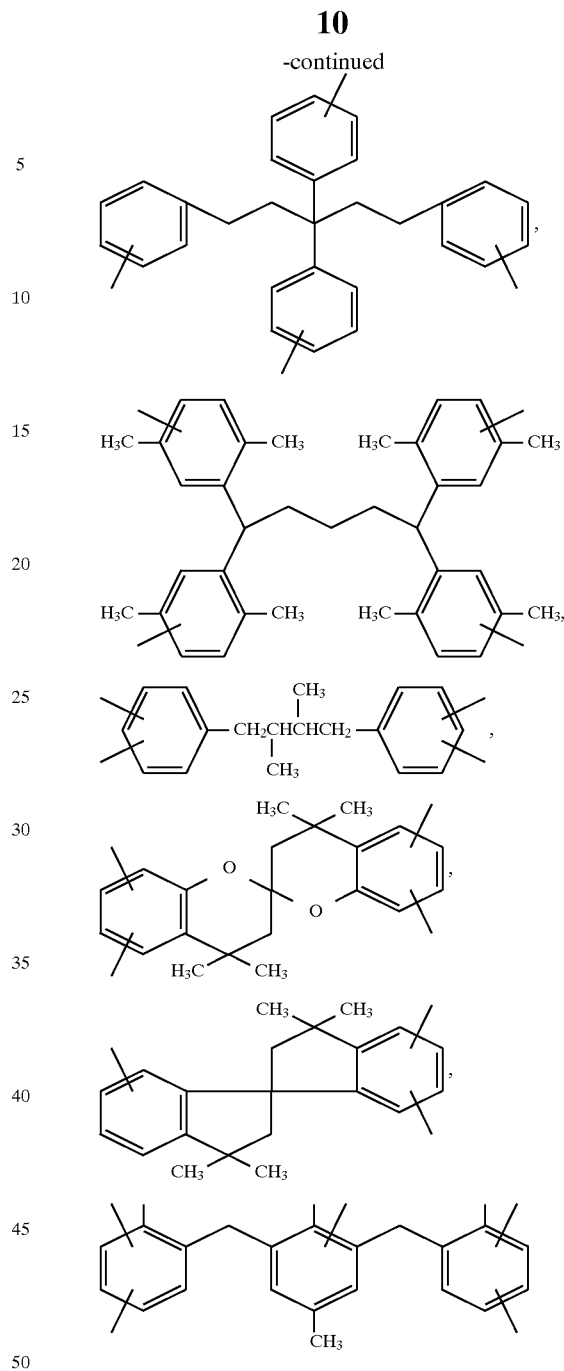

The compounds of formula (I) can be synthesized, for example, by the method described in Stephen C. Lapin, Polymers Paint Colour Journal, 179 (4237), 321 (1988), more specifically by reacting polyhydric alcohols or polyhydric phenols with acetylene or reacting polyhydric alcohols or polyhydric phenols with halogenated alkyl vinyl ethers. Illustrative, non-limiting examples of the compound of formula (I) include ethylene glycol divinyl ether, triethylene glycol divinyl ether, 1,3-butane diol divinyl ether, tetramethylene glycol divinyl ether, neopentyl glycol divinyl ether, trimethylol propane trivinyl ether, trimethylol ethane trivinyl ether, hexane diol divinyl ether, 1,4-cyclohexane diol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylol propane triethylene vinyl ether, trimethylol propane diethylene vinyl ether, pentaerythritol diethylene vinyl ether, pentaerythritol triethylene vinyl ether, pentaerythritol tetraethylene vinyl ether as well as the compounds of the following formulae (I-1) through (I-31).
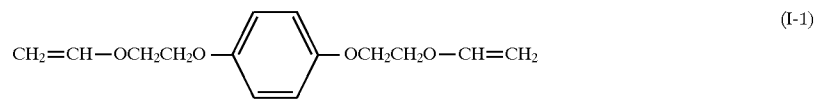
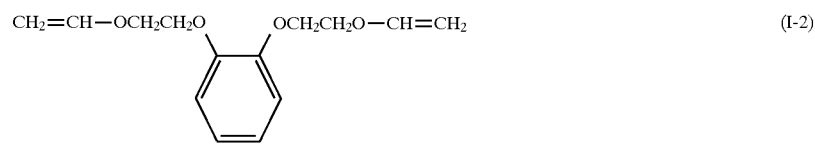
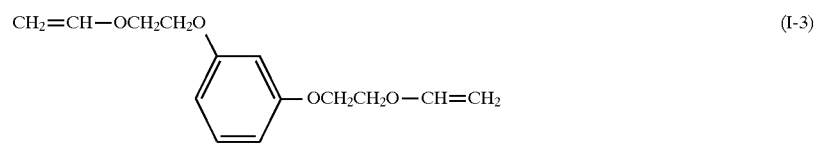
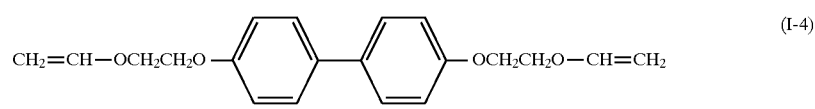
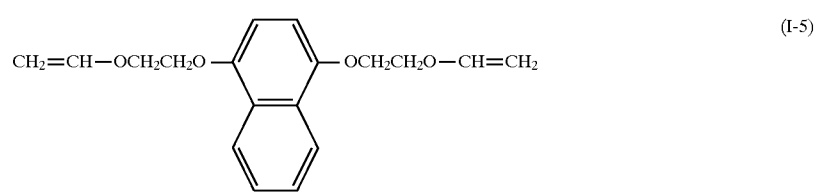
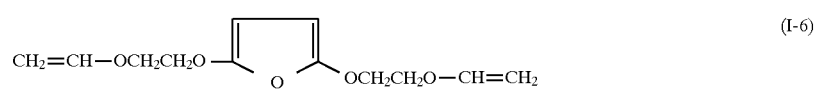
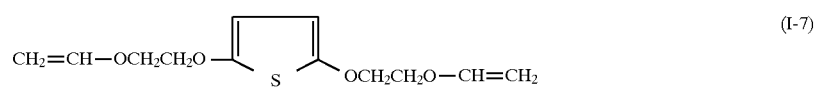
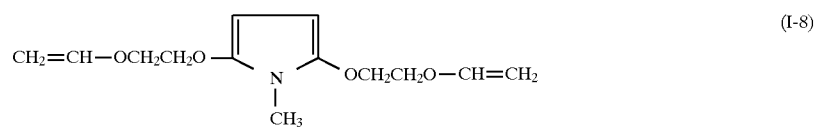
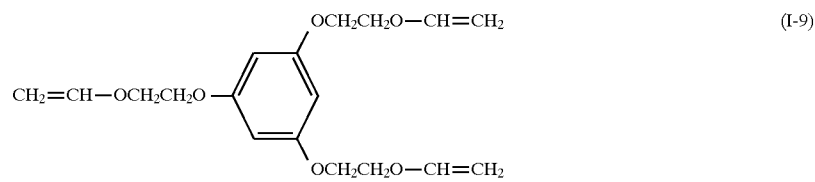
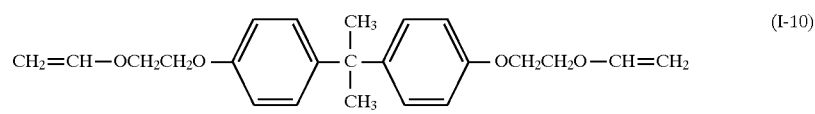
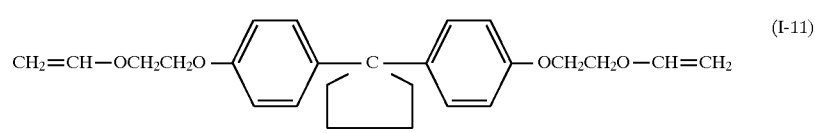
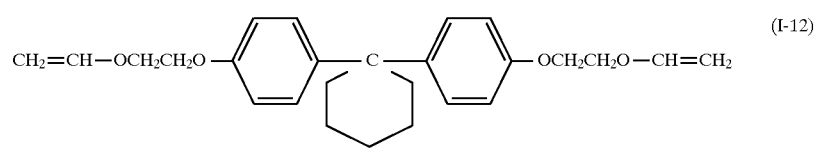

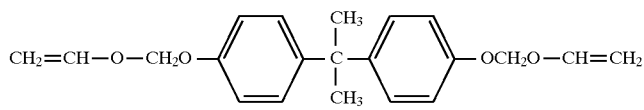 (I-13)
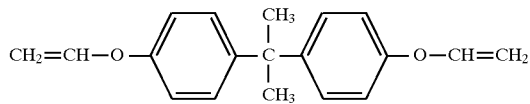 (I-14)
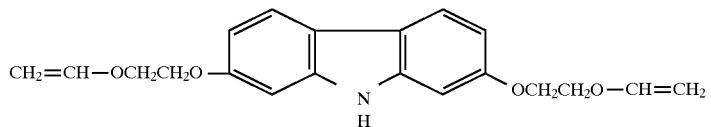 (I-15)
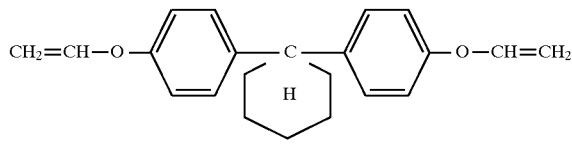 (I-16)
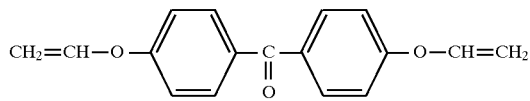 (I-17)
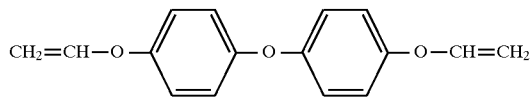 (I-18)
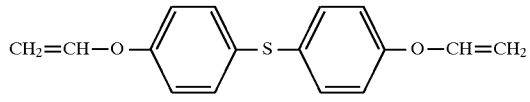 (I-19)
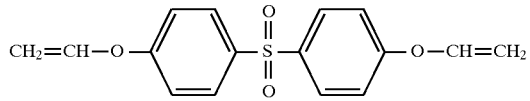 (I-20)
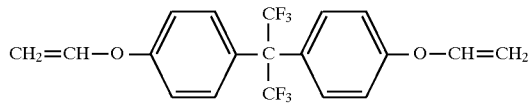 (I-21)
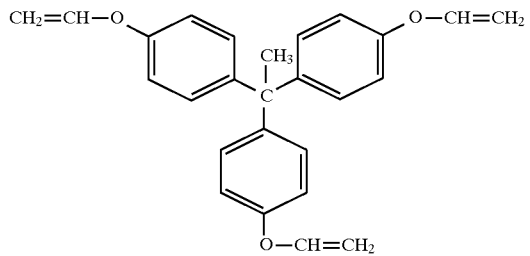 (I-22)
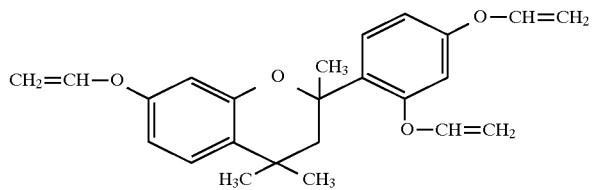 (I-23)

-continued
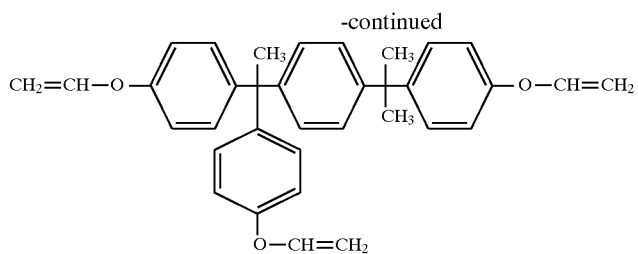 (I-24)
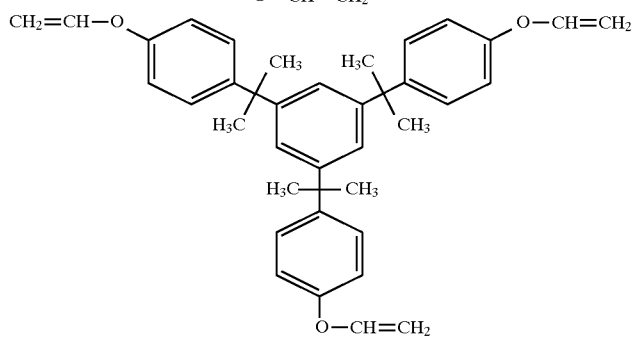 (I-25)
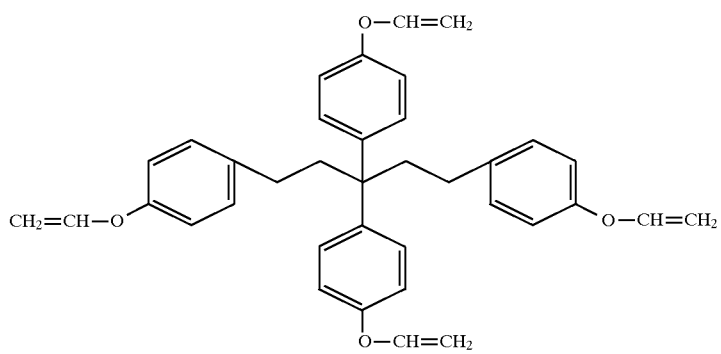 (I-26)
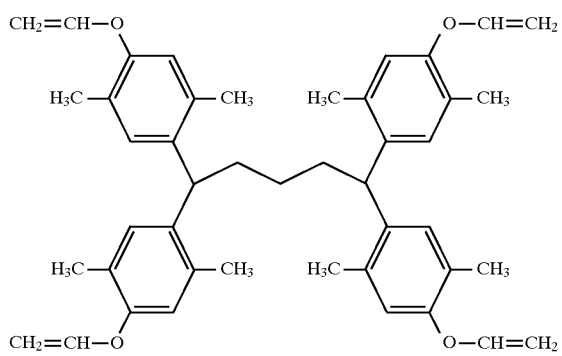 (I-27)
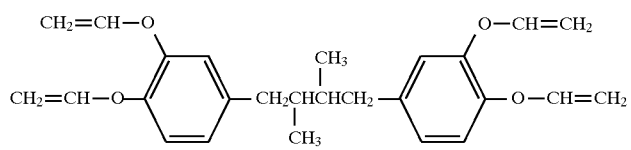 (I-28)
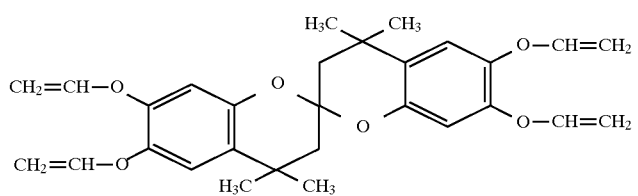 (I-29)

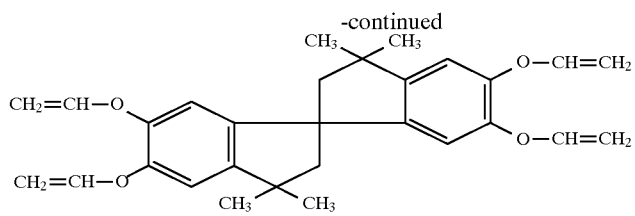
(I-30)

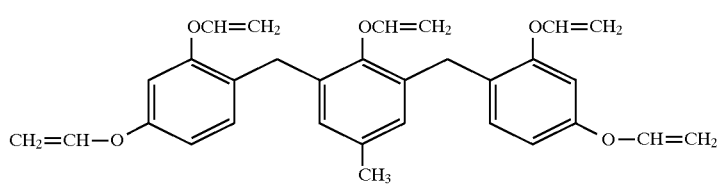
(I-31)

The compounds of formula (II) wherein B is —CO—O— can be synthesized by reacting polyvalent carboxylic acids with halogenated alkyl vinyl ethers. Illustrative, non-limiting examples include terephthalic diethylene vinyl ether, phthalic diethylene vinyl ether, isophthalic diethylene vinyl ether, phthalic dipropylene vinyl ether, terephthalic dipropylene vinyl ether, isophthalic dipropylene vinyl ether, maleic diethylene vinyl ether, fumaric diethylene vinyl ether, and itaconic diethylene vinyl ether.

Other useful vinyl ether group-containing compounds which can be used herein are vinyl ether group-containing compounds which are synthesized by reacting vinyl ether compounds having active hydrogen as represented by the following formulae (III), (IV), and (V) with compounds having an isocyanato group.

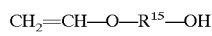 (III)

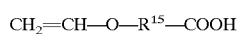 (IV)

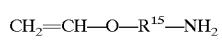 (V)

In the formulae, $R^{15}$ is a normal or branched alkylene group having 1 to 10 carbon atoms. The compounds having an isocyanato group may be those compounds described in "Handbook of Crosslinking Agents," Taiseisha, 1981, for example. Exemplary are polyisocyanates such as triphenylmethane triisocyanate, diphenylmethane diisocyanate, tolylene diisocyanate, 2,4-tolylene diisocyanate dimer, naphthalene-1,5-diisocyanate, o-tolylene diisocyanate, polymethylene polyphenyl isocyanate, and hexamethylene diisocyanate; and polyisocyanate adducts such as an addition product of tolylene diisocyanate and trimethylolpropane, an addition product of hexamethylene diisocyanate and water, and an addition product of xylene diisocyanate and trimethylolpropane. By reacting isocyanato group-containing compounds with active hydrogen-containing vinyl ether compounds, there are obtained various compounds having a vinyl ether group at an end. These compounds are exemplified by the following formulae (VI-1) through (VI-11), though not limited thereto.

(VI-1)

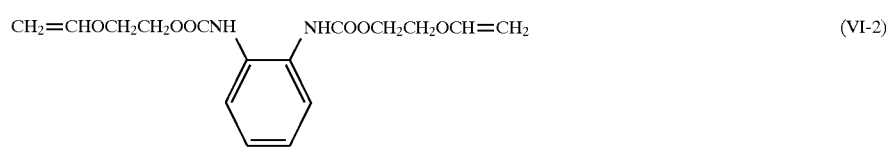
(VI-2)

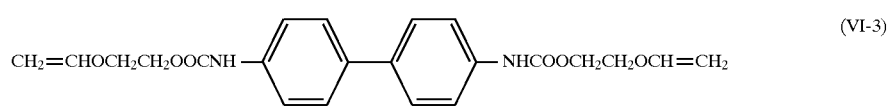
(VI-3)

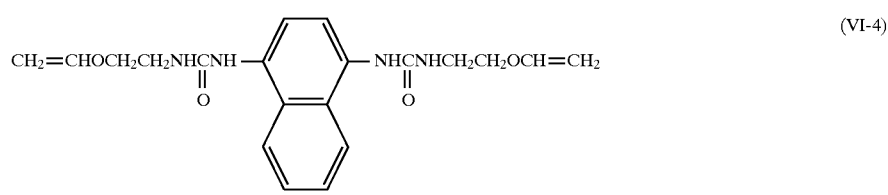
(VI-4)

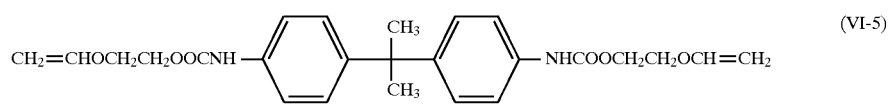
(VI-5)

-continued

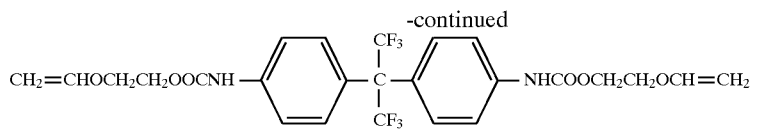 (VI-6)

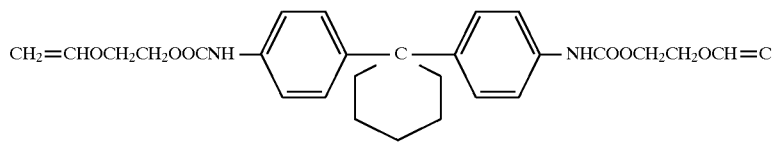 (VI-7)

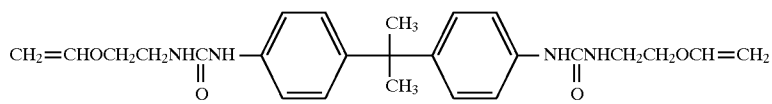 (VI-8)

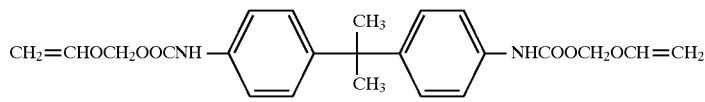 (VI-9)

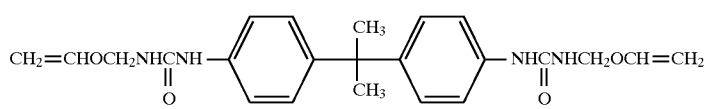 (VI-10)

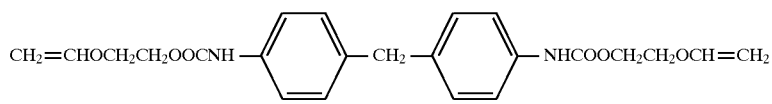 (VI-11)

The vinyl ether group-containing compound (D) is preferably blended in an amount of about 0.5 to 24 parts, especially about 1 to 10 parts. If the amount of the vinyl ether group-containing compound blended is less than 0.5 part, there would be formed less crosslinks with base resin (A), failing to improve heat resistance. If the amount of the vinyl ether group-containing compound blended is more than 24 parts, there would be formed excessive crosslinks, which prevent the acid catalyst from promoting elimination reaction, resulting in low resolution.

The dissolution rate regulator (E) is a compound having a molecular weight of 100 to 1,000 and at least two phenolic hydroxyl groups in a molecule, the hydrogen atom of the phenolic hydroxyl group being replaced by an acid labile group in an average proportion of 10% to 100%, preferably 30 to 100% of the entire phenolic hydroxyl groups. With a percent replacement of less than 10%, no effective dissolution control would be achievable.

The compound having at least two phenolic hydroxyl groups in a molecule as dissolution rate regulator (D) is exemplified by compounds of the following general formulae (4) to (14):

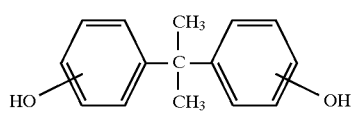 (4)

-continued

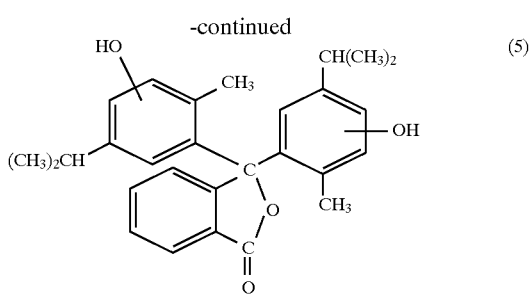 (5)

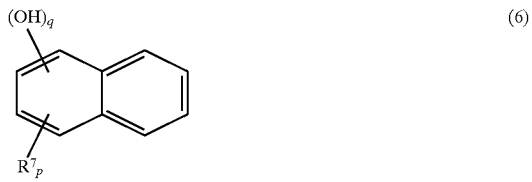 (6)

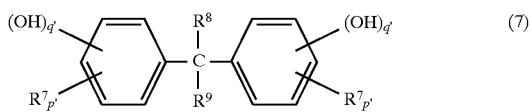 (7)

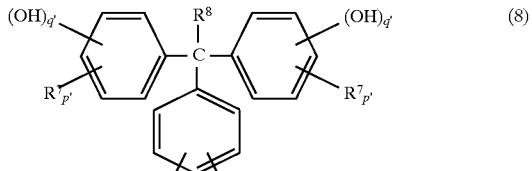 (8)

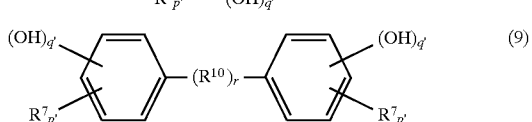 (9)

-continued

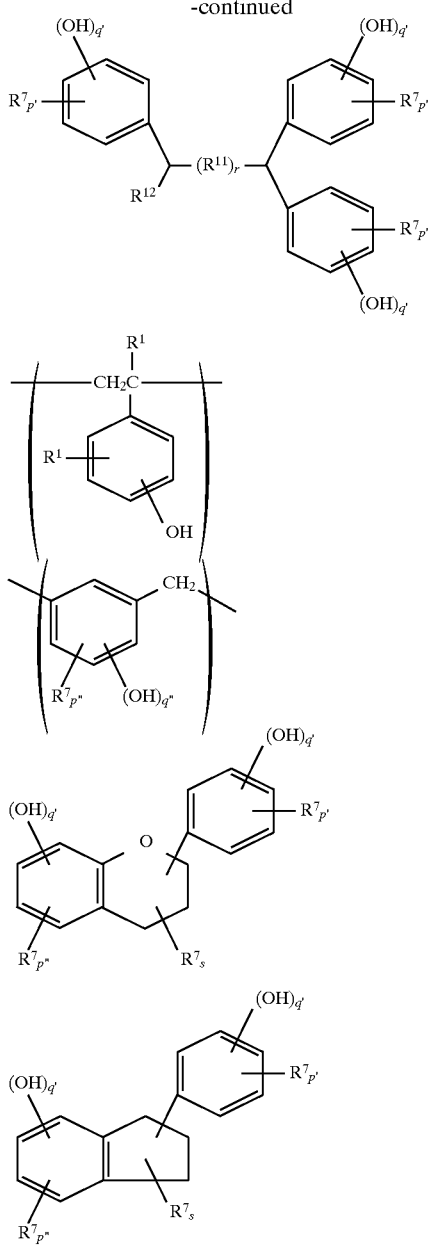

In the formulae, $R^1$ is a hydrogen atom or methyl group,
$R^7$ and $R^8$ are independently a hydrogen atom or normal or branched alkyl or alkenyl group having 1 to 8 carbon atoms,
$R^9$ is a hydrogen atom, normal or branched alkyl or alkenyl group having 1 to 8 carbon atoms, or —$(R^{13})_r$—COOH,
each of $R^{10}$ and $R^{11}$ is an alkylene group having 1 to 10 carbon atoms, arylene group having 6 to 10 carbon atoms, carbonyl group, sulfonyl group, oxygen atom or sulfur atom,
$R^{12}$ is a hydrogen atom, normal or branched alkyl group having 1 to 8 carbon atoms, alkenyl group, hydroxyl-substituted phenyl or naphthyl group,
$R^{13}$ is a normal or branched alkylene group having 1 to 10 carbon atoms,
letter s is an integer of 0 to 3,
r is 0 or 1, and
p, q, p', q', p", and q" are numbers satisfying p+q=8, p'+q'=5, and p"+q"=4 such that at least one hydroxyl group is attached to each phenyl skeleton.

Exemplary groups represented by $R^7$ and $R^8$ are hydrogen, methyl, ethyl, n-propyl, isopropyl, n-butyl, isobutyl, sec-butyl, tert-butyl, ethynyl, and cyclohexyl groups. Exemplary groups represented by $R^9$ are hydrogen, methyl, ethyl, n-propyl, isopropyl, n-butyl, isobutyl, sec-butyl, tert-butyl, ethynyl, and cyclohexyl as well as —COOH, —CH$_2$COOH and —CH$_2$CH$_2$COOH. Exemplary groups represented by $R^{10}$ and $R^{11}$ are methylene, ethylene, phenylene, carbonyl, and sulfonyl groups, oxygen and sulfur atoms. Exemplary groups represented by $R^{12}$ are hydrogen, methyl, ethyl, n-propyl, isopropyl, n-butyl, isobutyl, sec-butyl, tert-butyl, ethynyl, cyclohexyl, and hydroxyl-substituted phenyl and naphthyl groups.

The acid labile group in the compound having a phenolic hydroxyl group includes examples as mentioned for $R^2$ and $R^3$.

The dissolution rate regulator is preferably blended in the resist composition in an amount of 0 to about 40 parts, more preferably about 10 to 25 parts by weight. More than 40 parts of the dissolution rate regulator would lower an alkali dissolution rate to detract from resolution. Additionally heat resistance lowers because monomeric components become excessive.

Also preferred as the dissolution rate regulator (E) is a compound having a molecular weight of more than 1,000 to 3,000 and at least two phenolic hydroxyl groups in a molecule, the hydrogen atom of the phenolic hydroxyl group being partially replaced by an acid labile group in an average proportion of more than 0% to 60%, especially more than 0% to 40% of the entire phenolic hydroxyl groups. No satisfactory dissolution control is achieved with a degree of substitution of 0% whereas a degree of substitution of more than 60% causes phase separation between polymers, that is, a loss of compatibility.

Illustrative examples of the compound having a phenolic hydroxyl group are those of formulae (11) and (12). The acid labile group in the compound having a phenolic hydroxyl group includes examples as mentioned for $R^2$ and $R^3$.

The dissolution rate regulator is preferably blended in an amount of 0 to about 40 parts, more preferably about 6 to 30 parts by weight. More than 40 parts of the dissolution rate regulator would be less compatible with the base resin, resulting in a resist film losing uniformity.

In the resist composition of the invention, a basic compound (F) is optionally blended. The basic compound is preferably a compound which can suppress the diffusion rate at which the acid generated from the photoacid generator diffuses into a resist coating. The blending of such a basic compound suppresses the diffusion rate of acid in a resist coating to improve resolution, suppresses a change of sensitivity after exposure, and mitigates substrate and environment dependency, achieving improvements in exposure margin and pattern profile.

Included in the basic compound are primary, secondary and tertiary aliphatic amines, hybrid amines, aromatic amines, heterocyclic amines, carboxyl-bearing nitrogenous compounds, sulfonyl-bearing nitrogenous compounds, hydroxyl-bearing nitrogenous compounds, hydroxyphenyl-bearing nitrogenous compounds, alcoholic nitrogenous compounds, amide derivatives, and imide derivatives.

Examples of the primary aliphatic amine include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of the secondary aliphatic amine include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of the tertiary aliphatic amine include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of the hybrid amine include dimethylethylamine, methylethylpropylamine, benzylamine, phenethylamine, and benzyldimethylamine. Examples of the aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinylpyridine, 1-methyl-4-phenylpyridine, 2-(1-ethylpropyl)-pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinoline-carbonitrile), isoquinoline derivatives, cinnoline derivatives, quinazoline derivatives, quinoaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the carboxyl-bearing nitrogenous compound include aminobenzoic acid, indolecarboxylic acid, amino acid derivatives such as nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine. Examples of the sulfonyl-bearing nitrogenous compound include 3-pyridinesulfonic acid and pyridinium p-toluenesulfonate. Examples of the hydroxyl-bearing nitrogenous compound, hydroxyphenyl-bearing nitrogenous compound, and alcoholic nitrogenous compound include 2-hydroxypyridine, aminocresole, 2,4-quinoline diol, 3-indolemethanolhydrate, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propane diol, 3-pyrrolidino-1,2-propane diol, 3-quinuclidinol, 3-tropanol, 1-methyl-2-pyrrolidine ethanol, 1-aziridine ethanol, N-(2-hydroxyethyl) phthalimide, and N-(2-hydroxyethyl)-isonicotinamide. Examples of the amide derivative include formamide, N-methylformamide, N,N-dimethylformamide, acetamide, N-methylacetamide, N,N-dimethylacetamide, propionamide, and benzamide. Exemplary imide derivatives are phthalimide, succinimide, and maleimide. Preferred among others are triethylamine, N,N-dimethylaniline, N-methylpyrrolidone, pyridine, quinoline, nicotinic acid, triethanolamine, piperidine ethanol, N,N-dimethylacetamide, and succinimide.

Preferably the basic compound is blended in an amount of 0 to about 2 parts, especially about 0.01 to 1 part by weight. More than 2 parts of the basic compound would adversely affect sensitivity.

The resist composition of the invention may further contain various additives, for example, a surface-active agent for facilitating coating and a light-absorbing agent for reducing irregular reflection from the substrate. The amounts of such optional additives blended are conventional insofar as the objects of the invention are not impaired. Examples of the surfactant include perfluoroalkylpolyoxyethylene ethanols, fluorinated alkyl esters, and perfluoroalkylamine oxides. Examples of the light-absorbing agent include diaryl sulfoxides, diaryl sulfones, 9,10-dimethylanthracene, and 9-fluorenone.

Any well-known lithography may be used to form a resist pattern from a chemically amplified positive resist composition of the invention. For example, the resist composition is spin coated onto a silicon wafer, prebaked at 80° to 120° C. to form a resist film of 0.5 to 2.0 μm thick, exposed to actinic radiation such as deep-UV, electron beam, and X-ray, and baked at 70° to 120° C. for 30 to 200 seconds (post-exposure baking=PEB), and developed with an aqueous base solution. The resist composition of the invention is especially suitable for fine patterning with deep-UV radiation of 254 to 193 nm and X-ray.

There has been described a chemically amplified positive resist composition which is highly sensitive to actinic radiation, especially KrF excimer laser light and X-ray, and has improved sensitivity, resolution and plasma etching resistance. The resulting resist pattern is fully resistant to heat.

EXAMPLE

Examples of the present invention are given below by way of illustration and not by way of limitation. All parts are by weight.

Examples 1–17 & Comparative Example 1–4

Liquid resist compositions were prepared by dissolving 80 parts of a base resin, 5 parts of a photoacid generator, 2 parts of a vinyl ether group-containing compound, a dissolution rate regulator, a basic compound, and 0.1 part of a surfactant in a solvent in accordance with the formulation shown in Table 1. Each of the compositions was passed through a 0.1 μm Teflon® filter.

The base resins used were polyhydroxystyrenes having the hydrogen atom of some hydroxyl groups replaced by an acid labile group, designated Polym.1 to Polym.4.

The photoacid generators used were PAG.1 to PAG.3.

The vinyl ether group-containing compounds used were CL.1 to CL.3.

The dissolution rate regulators used were compounds designated DRR.1 and DRR.2. The foregoing compounds are illustrated below by chemical formulae.

The basic compounds used were shown in Table 1.

The surfactant used was Florade FC-430.

The solvents used were 2-methoxy ethyl ether (DGLM), 1-ethoxy-2-propanol (EIPA), a 85%/15% by weight mixture of ethyl lactate and butyl acetate (EL/BA), and propylene glycol monomethyl acetate (PGMEA).

Each liquid resist composition was then spin coated onto a silicon wafer to form a coating of 0.7 μm thick. With the silicon wafer rested on a hot plate at 120°C., the coating was pre-baked for 90 seconds. The film was exposed to a pattern of light by means of an excimer laser stepper model NSR-2005EX8A (manufactured by Nikon K.K., numerical aperture NA=0.5), baked at 110° C. for 90 seconds, and developed with an aqueous solution of 2.38% tetramethylammonium hydroxide, obtaining a positive pattern.

The resulting resist pattern was evaluated as follows. First, a sensitivity (Eth value) was determined. Provided that the exposure quantity with which the top and bottom of a 0.26-μm line-and-space pattern were resolved at 1:1 was the optimum exposure (sensitivity Eop), the minimum line width of a line-and-space pattern which was recognized separate at this exposure was the resolution of a test resist. The profile of the resist pattern resolved was observed under a scanning electron microscope.

In a heat resistance test, each resist pattern was heated on a hot plate at 130° C. for 5 minutes to observe any change of pattern shape before and after heating. The resist pattern was rated "O" (passed) for no change of pattern shape before and after heating and "X" (rejected) when the pattern was degraded by sagging after heating.

Table 1 shows the formulation of resist compositions. The test results are shown in Table 2.

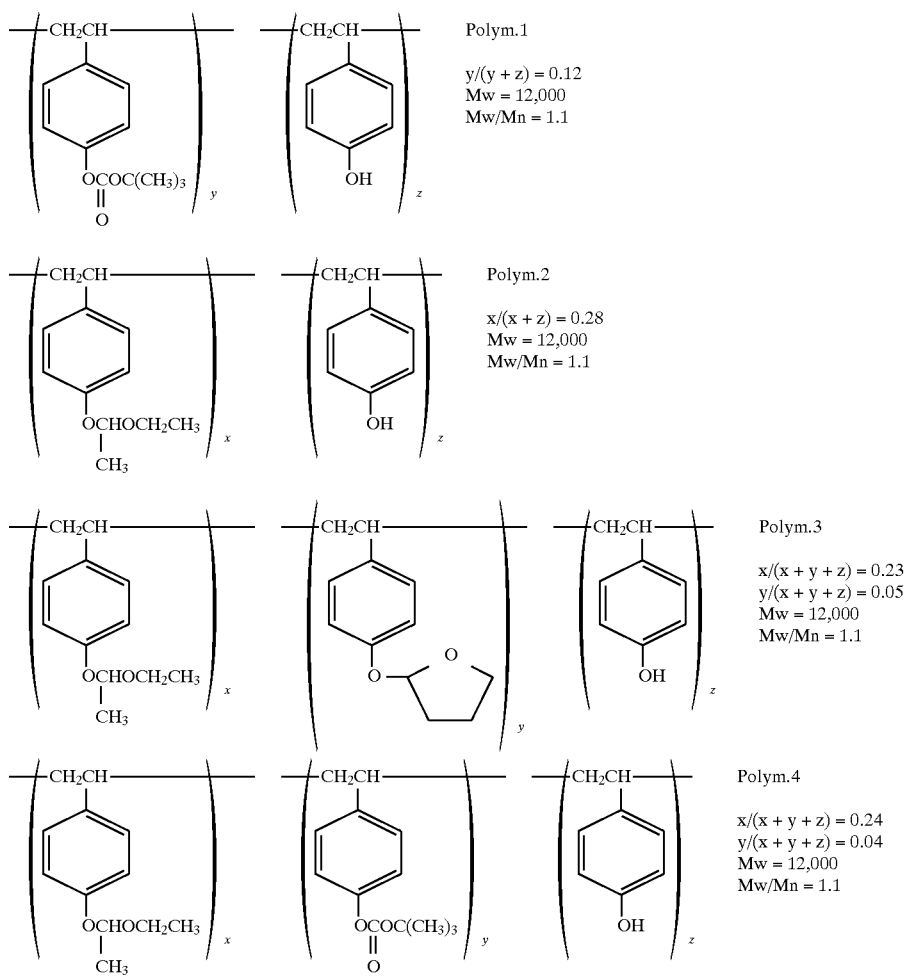

-continued
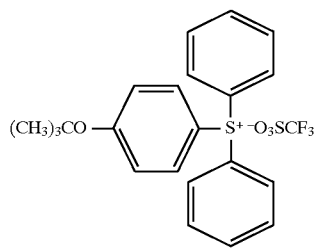
PAG.1
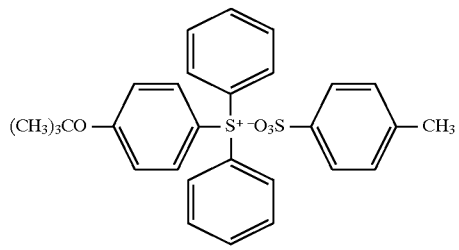
PAG.2
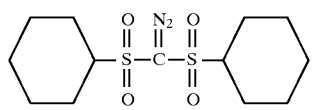
PAG.3
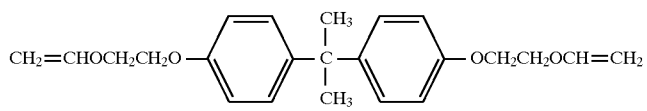
CL.1
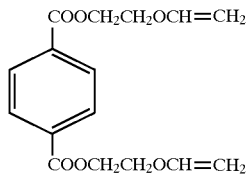
CL.2
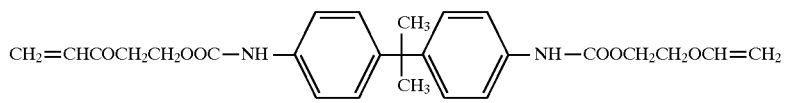
CL.3
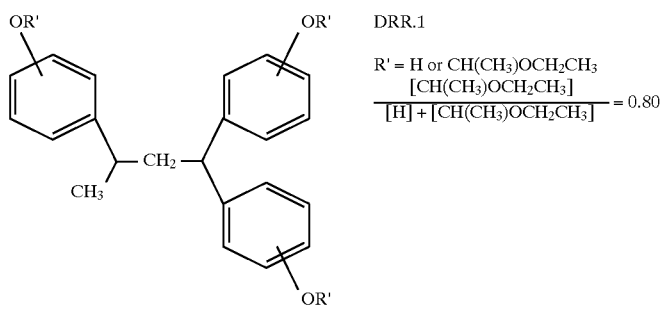
DRR.1
R' = H or CH(CH$_3$)OCH$_2$CH$_3$
$$\frac{[CH(CH_3)OCH_2CH_3]}{[H]+[CH(CH_3)OCH_2CH_3]} = 0.80$$
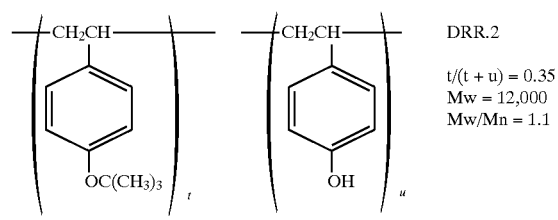
DRR.2
t/(t + u) = 0.35
Mw = 12,000
Mw/Mn = 1.1

TABLE 1

| No. | Base resin | Photoacid generator | Vinyl ether compound | Dissolution rate regulator | Basic compound | Organic solvent |
|---|---|---|---|---|---|---|
| 1 | Polym.1 (80) | PAG.1 (4) | CL.1 (2) | DRR.1 (16) | — | DGLM (300) |
| 2 | Polym.1 (80) | PAG.1 (4) | CL.1 (2) | DRR.1 (16) | N-methylpyrrolidone (0.1) | DGLM (300) |
| 3 | Polym.2 (80) | PAG.2 (4) | CL.2 (2) | — | — | EIPA (580) |
| 4 | Polym.2 (80) | PAG.2 (4) | CL.2 (2) | — | quinoline (0.06) | EIPA (580) |
| 5 | Polym.3 (80) | PAG.3 (4) | CL.1 (4) | — | — | EL/BA (510) |
| 6 | Polym.3 (80) | PAG.3 (4) | CL.1 (4) | — | N,N-dimethylacetamide (5.0) | EL/BA (510) |
| 7 | Polym.4 (80) | PAG.2 (2) | CL.1 (2) | DRR.1 (8) | — | PGMEA (530) |
| 8 | Polym.4 (80) | PAG.2 (2) | CL.1 (2) | DRR.2 (8) | — | PGMEA (530) |
| 9 | Polym.4 (80) | PAG.2 (2) | CL.1 (2) | DRR.1(4) DRR.2(4) | — | PGMEA (530) |
| 10 | Polym.4 (80) | PAG.2 (2) | CL.1 (2) | — | triethanolamine (0.06) | PGMEA (530) |
| 11 | Polym.4 (80) | PAG.1(1) PAG.2(1) | CL.1 (2) | — | triethanolamine (0.06) | PGMEA (530) |
| 12 | Polym.4 (80) | PAG.2 (1) | CL.3 (2) | — | — | PGMEA (530) |
| 13 | Polym.4 (80) | PAG.2 (1) | CL.3 (2) | — | piperidine ethanol (0.08) | PGMEA (530) |
| 14 | Polym.4 (80) | PAG.2(1) PAG.3(1) | CL.1 (2) | — | — | PGMEA (530) |
| 15 | Polym.4 (80) | PAG.2(1) PAG.3(2) | CL.1 (2) | — | triethanolamine (0.06) | PGMEA (530) |
| 16 | Polym.4 (80) | PAG.2 (2) | CL.1 (2) | — | — | PGMEA (530) |
| 17 | Polym.4 (80) | PAG.2 (2) | CL.1 (2) | — | tributylamine (0.03) N,N-dimethylacetamide (5.0) | PGMEA (530) |
| 18 | Polym.1 (80) | PAG.1 (4) | — | DRR.1 (16) | — | DGLM (300) |
| 19 | Polym.1 (80) | PAG.1 (4) | — | DRR.1 (16) | N-methylpyrrolidone (0.1) | DGLM (300) |
| 20 | Polym.4 (80) | PAG.2 (2) | — | — | — | PGMEA (530) |
| 21 | Polym.4 (80) | PAG.2 (2) | — | — | tributylamine (0.03) N,N-dimethylacetamide (5.0) | PGMEA (530) |

TABLE 2

| | Resist film No. | Sensitivity Eop (mJ/cm$^2$) | Resolution ($\mu$m) | Profile | Heat resistance |
|---|---|---|---|---|---|
| Example | | | | | |
| 1 | 1 | 4.0 | 0.22 | rectangular | ○ |
| 2 | 2 | 14.0 | 0.20 | rectangular | ○ |
| 3 | 3 | 3.0 | 0.22 | rectangular | ○ |
| 4 | 4 | 6.0 | 0.20 | rectangular | ○ |
| 5 | 5 | 3.0 | 0.22 | recta.ngular | ○ |
| 6 | 6 | 8.0 | 0.20 | rectangular | ○ |
| 7 | 7 | 4.0 | 0.22 | rectangular | ○ |
| 8 | 8 | 4.0 | 0.22 | rectangular | ○ |
| 9 | 9 | 4.0 | 0.22 | rectangular | ○ |
| 10 | 10 | 7.0 | 0.20 | rectangular | ○ |
| 11 | 11 | 7.0 | 0.20 | rectangular | ○ |
| 12 | 12 | 12.0 | 0.22 | rectangular | ○ |
| 13 | 13 | 63.0 | 0.20 | rectangular | ○ |
| 14 | 14 | 4.0 | 0.22 | rectangular | ○ |
| 15 | 15 | 22.0 | 0.20 | rectangular | ○ |
| 16 | 16 | 3.0 | 0.22 | rectangular | ○ |
| 17 | 17 | 17.0 | 0.20 | rectangular | ○ |
| Comparative Example | | | | | |
| 1 | 18 | 3.0 | 0.24 | forward taper | x |
| 2 | 19 | 14.0 | 0.24 | forward taper | x |
| 3 | 20 | 3.0 | 0.24 | forward taper | x |
| 4 | 21 | 16.0 | 0.24 | forward taper | x |

Japanese Patent Application No. 104590/1996 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A chemically amplified positive resist composition comprising (A) an organic solvent, (B) a base resin in the form of a polymer having recurring units of the following general formula (1), and having a weight-average molecular weight of 3,000 to 300,000,

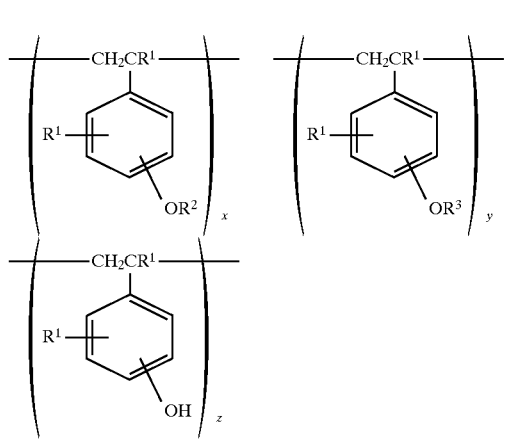

(1)

wherein $R^1$ is a hydrogen atom or methyl group, $R^2$ is a group represented by the following general formula (2):

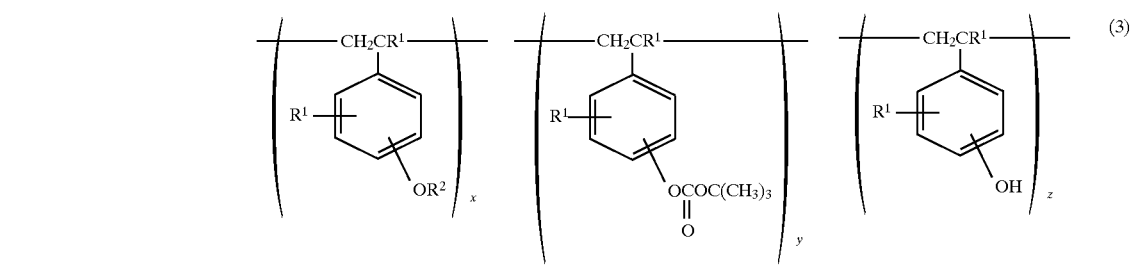

(2)

wherein $R^4$ and $R^5$ are independently a hydrogen atom or a normal or branched alkyl group having 1 to 6 carbon atoms, $R^6$ is a normal, branched or cyclic alkyl group having 1 to 10 carbon atoms, or $R^4$ and $R^5$, $R^4$ and $R^6$, or $R^5$ and $R^6$, taken together, may form a ring wherein $R^4$, $R^5$ and $R^6$ are independently a normal or branched alkylene group having 1 to 6 carbon atoms, $R^3$ is an acid labile group different from $R^2$, and letters x and y are 0 or a positive number, x and y are not equal to 0 at the same time, and z is a positive number, x, y and z satisfy $0 \leq x/(x+y+z) \leq 0.5$, $0 \leq y/(x+y+z) \leq 0.5$, $0.4 \leq z/(x+y+z) \leq 0.9$, and $x+y+z=1$, (C) a photoacid generator, and (D) a compound having at least two vinyl ether groups in a molecule.

2. A chemically amplified positive resist composition comprising (A) an organic solvent, (B) a base resin in the form of a polymer of formula (1) as set forth in claim 1, (C) a photoacid generator, (D) a compound having at least two vinyl ether groups in a molecule, and (E) a dissolution rate regulator.

3. The chemically amplified positive resist composition of claim 2 wherein said dissolution rate regulator (E) is a compound having a molecular weight of 100 to 1,000 and at least two phenolic hydroxyl groups in a molecule, the hydrogen atom of the phenolic hydroxyl group being replaced by an acid labile group in an average proportion of 10 to 100% of the entire phenolic hydroxyl groups.

4. The chemically amplified positive resist composition of claim 2 wherein said dissolution rate regulator (E) is a compound having a molecular weight of more than 1,000 to 3,000 and at least two phenolic hydroxyl groups in a molecule, the hydrogen atom of the phenolic hydroxyl group being partially replaced by an acid labile group in an average proportion of more than 0% to 60% of the entire phenolic hydroxyl groups.

5. The chemically amplified positive resist composition of claim 1 wherein said base resin (B) is a polymer having recurring units of the following general formula (3), and having a weight-average molecular weight of 3,000 to 300,000,

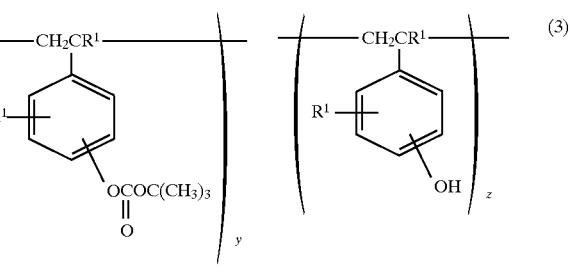

(3)

wherein $R^1$, $R^2$, x, y, and z are as defined above.

6. The chemically amplified positive resist composition of claim 1 wherein the polymer as base resin (B) is a monodisperse polymer having a dispersity of 1.0 to 1.5.

7. The chemically amplified positive resist composition of claim 1 further comprising (F) a basic compound.

8. The chemically amplified positive resist composition of claim 1 wherein said photoacid generator (C) is an onium salt.

9. The chemically amplified positive resist composition of claim 2 wherein said base resin (B) is a polymer having recurring units of the following general formula (3), and having a weight-average molecular weight of 3,000 to 300,000,

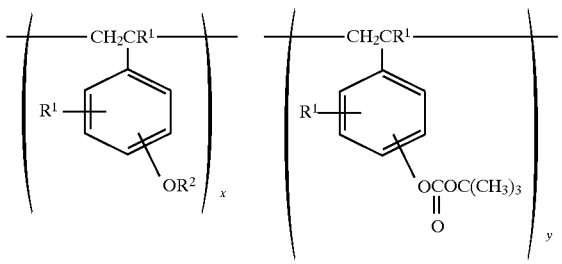
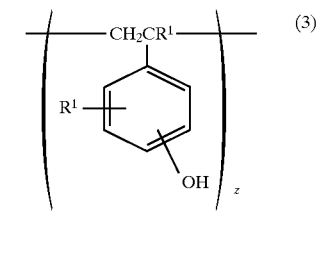

wherein $R^1$, $R^2$, x, y and z are as defined above.

10. The chemically amplified positive resist composition of claim 2 wherein the polymer as base resin (B) is a monodisperse polymer having a dispersity of 1.0 to 1.5.

11. The chemically amplified positive resist composition of claim 2 further comprising (F) a basic compound.

12. The chemically amplified positive resist composition of claim 2 wherein said photoacid generator (C) is an onium salt.

13. The chemically amplified positive resist composition of claim 1 wherein y is a positive number and $R^3$ is tert-butyl, tert-butoxycarbonyl, tert-butoxycarbonylmethyl, or 3-oxycyclohexyl.

14. The chemically amplified positive resist composition of claim 2 wherein y is a positive number and $R^3$ is tert-butyl, tert-butoxycarbonyl, tert-butoxycarbonylmethyl, or 3-oxycyclohexyl.

15. The chemically amplified positive resist composition of claim 1 wherein x is a positive number satisfying $0.1 \leq x/(x+y+z) \leq 0.4$.

16. The chemically amplified positive resist composition of claim 2 wherein x is a positive number satisfying $0.1 \leq x/(x+y+z) \leq 0.4$.

17. The chemically amplified positive resist composition of claim 1 wherein x is a positive number satisfying $0.1 \leq x/(x+y+z) \leq 0.4$, and y is a positive number.

18. The chemically amplified positive resist composition of claim 2 wherein x is a positive number satisfying $0.1 \leq x/(x+y+z) \leq 0.4$, and y is a positive number.

19. The chemically amplified positive resist composition of claim 17 wherein $R^3$ is tert-butyl, tert-butoxycarbonyl, tert-butoxycarbonylmethyl, or 3-oxycyclohexyl.

20. The chemically amplified positive resist composition of claim 1, which contains about 150 to 700 parts by weight of the organic solvent, (A), 70 to 90 parts of the base resin, (B), 0.5 to 15 parts by weight of the photoacid generator, (C), and 0.5 to 24 parts by weight of the compound having at least two vinyl ether groups in a molecule, (D).

21. The chemically amplified positive resist composition of claim 2, which contains about 150 to 700 parts by weight of the organic solvent, (A), 70 to 90 parts of the base resin, (B), 0.5 to 15 parts by weight of the photoacid generator, (C), 0.5 to 24 parts by weight of the compound having at least two vinyl ether groups in a molecule, (D), and 6 to 30 parts by weight of the dissolution rate regulator, (E).

22. The chemically amplified positive resist composition of claim 1, wherein the organic solvent is 1-ethoxy-2-propanol, propylene glycol monomethyl ether acetate or a mixture thereof.

23. The chemically amplified positive resist composition of claim 1, wherein the organic solvent is 1-ethoxy-2-propanol, propylene glycol monomethyl ether acetate or a mixture thereof.

24. The chemically amplified positive resist composition of claim 1, wherein the polymer of formula (1) has a weight-average molecular weight of 5,000 to 30,000.

25. The chemically amplified positive resist composition of claim 2, wherein the polymer of formula (1) has a weight-average molecular weight of 5,000 to 30,000.

26. The chemically amplified positive resist composition of claim 1, wherein the compound having at least two vinyl ether groups in a molecule is a vinyl ether compound of one of the following formulae (I) and (II), $$A\text{---}[\text{---}O\text{---}(R^{14}\text{---}O)_n\text{---}CH=CH_2]_m \quad (I)$$

$$A\text{---}[\text{---}B\text{---}R^{14}\text{---}O\text{---}CH=CH_2]_m \quad (II)$$

wherein A is an alkyl, aryl or heterocyclic group having a valence of m, B is —CO—O—, —NHCOO— or —NHCONH—, $R^{14}$ is a normal or branched alkylene group having 1 to 10 carbon atoms, letter n is 0 or an integer of 1 to 10, and letter m is an integer of 2 to 6.

27. The chemically amplified positive resist composition of claim 2, wherein the compound having at least two vinyl ether groups in a molecule is a vinyl ether compound of one of the following formulae (I) and (II), $$A\text{---}[\text{---}O\text{---}(R^{14}\text{---}O)_n\text{---}CH=CH_2]_m \quad (I)$$

$$A\text{---}[\text{---}B\text{---}R^{14}\text{---}O\text{---}CH=CH_2]_m \quad (II)$$

wherein A is an alkyl, aryl or heterocyclic group having a valence of m, B is —CO—O—, —NHCOO— or —NHCONH—, $R^{14}$ is a normal or branched alkylene group having 1 to 10 carbon atoms, letter n is 0 or an integer of 1 to 10, and letter m is an integer of 2 to 6.

28. The chemically amplified positive resist composition of claim 1, wherein $R^3$ is tert-butyl, tert-butoxycarbonyl, tert-butoxycarbonylmethyl, 3-oxycyclohexyl or a group of the formula (2), different from $R^2$ when present.

29. The chemically amplified positive resist composition of claim 2, wherein $R^3$ is tert-butyl, tert-butoxycarbonyl, tert-butoxycarbonylmethyl, 3-oxycyclohexyl or a group of the formula (2), different from $R^2$ when present.

* * * * *